US009711422B2

(12) United States Patent
Ayotte et al.

(10) Patent No.: US 9,711,422 B2
(45) Date of Patent: *Jul. 18, 2017

(54) VISUALLY DETECTING ELECTROSTATIC DISCHARGE EVENTS

(71) Applicant: GLOBALFOUNDRIES Inc., George Town, KY (US)

(72) Inventors: Stephen P. Ayotte, Bristol, VT (US); David J. Hill, Richmond, VT (US); John T. Kinnear, Jr., LaGrangeville, NY (US); Glen E. Richard, Burlington, VT (US); Timothy M. Sullivan, Essex, VT (US); Heather M. Truax, Burlington, VT (US)

(73) Assignee: GLOBALFOUNDRIES INC., George Town (KY)

( * ) Notice: Subject to any disclaimer, the term of this patent is extended or adjusted under 35 U.S.C. 154(b) by 32 days.

This patent is subject to a terminal disclaimer.

(21) Appl. No.: 14/821,201

(22) Filed: Aug. 7, 2015

(65) Prior Publication Data

US 2015/0355253 A1 Dec. 10, 2015

Related U.S. Application Data

(63) Continuation of application No. 13/432,772, filed on Mar. 28, 2012, now Pat. No. 9,105,573.

(51) Int. Cl.
*G08B 21/00* (2006.01)
*H01L 21/66* (2006.01)
*G01R 31/00* (2006.01)

(52) U.S. Cl.
CPC .......... *H01L 22/24* (2013.01); *G01R 31/002* (2013.01); *H01L 2924/0002* (2013.01); *Y10T 29/49124* (2015.01)

(58) Field of Classification Search
CPC .... H05K 1/0254; H05K 1/0266; G01R 29/08; G01R 29/0857; G01R 29/0878; G01R 31/002; G01R 5/28
See application file for complete search history.

(56) References Cited

U.S. PATENT DOCUMENTS 3,627,408 A    12/1971   Ferguson
3,867,016 A     2/1975   Sagane
(Continued)

FOREIGN PATENT DOCUMENTS

EP         1057653 A1    6/2000

OTHER PUBLICATIONS

Henry, Leo G., and J. H. Mazur, "Basic Physics in Color-Coded EOS Metallization Failures (Differentiating between EOS and ESD)" ISTFA, Nov. 1998 Proceeding, No. 24, pp. 143-150.

(Continued)

*Primary Examiner* — John A Tweel, Jr.
*Assistant Examiner* — Adnan Aziz
(74) *Attorney, Agent, or Firm* — David Cain; Andrew M. Calderon; Roberts Mlotkowski Safran Cole & Calderon, P.C.

(57) ABSTRACT

Methods and structures provide an electrostatic discharge (ESD) indicator including an electric field sensitive material configured to undergo a specific color change in response to an electric field. An exposure of the structure to an ESD can be visually determined via the specific color change of the ESD indicator.

19 Claims, 5 Drawing Sheets

(56) References Cited

U.S. PATENT DOCUMENTS

| | | | |
|---|---|---|---|
| 3,975,287 A | 8/1976 | Sagane | |
| 4,033,685 A | 7/1977 | Uno et al. | |
| 5,315,255 A * | 5/1994 | Bettinger | G01R 29/12 |
| | | | 324/457 |
| 5,359,319 A | 10/1994 | Campbell et al. | |
| 5,673,028 A | 9/1997 | Levy | |
| 6,118,419 A | 9/2000 | Smith et al. | |
| 6,147,483 A | 11/2000 | Havel | |
| 6,172,496 B1 * | 1/2001 | Karins | G01R 5/28 |
| | | | 324/102 |
| 6,396,255 B2 | 5/2002 | Karins et al. | |
| 6,504,531 B1 * | 1/2003 | Sandbach | G06F 3/045 |
| | | | 178/18.05 |
| 6,583,612 B2 | 6/2003 | Karins et al. | |
| 6,791,738 B2 | 9/2004 | Reynolds et al. | |
| 7,864,398 B2 | 1/2011 | Dozeman et al. | |
| 8,044,813 B1 | 10/2011 | Dembo et al. | |
| 2008/0050113 A1 | 2/2008 | Mathes | |
| 2008/0081300 A1 | 4/2008 | Kikuchi et al. | |
| 2008/0297878 A1 | 12/2008 | Brown et al. | |
| 2010/0149630 A1 | 6/2010 | LeCain et al. | |
| 2010/0245971 A1 * | 9/2010 | Sotzing | G02F 1/1533 |
| | | | 359/265 |
| 2010/0328338 A1 | 12/2010 | Kim et al. | |
| 2011/0159619 A1 | 6/2011 | Tsuji et al. | |
| 2011/0235150 A1 | 9/2011 | Das et al. | |
| 2011/0286314 A1 | 11/2011 | Braunberger | |
| 2011/0292487 A1 | 12/2011 | Noh et al. | |
| 2012/0050938 A1 | 3/2012 | Dabov et al. | |
| 2012/0072139 A1 | 3/2012 | Reed et al. | |
| 2012/0145315 A1 | 6/2012 | Knaapila et al. | |
| 2013/0033378 A1 * | 2/2013 | Donovan | A43B 1/0027 |
| | | | 340/540 |
| 2013/0033735 A1 | 2/2013 | Noh et al. | |
| 2013/0286139 A1 | 10/2013 | Furuki et al. | |

OTHER PUBLICATIONS

M. Schadt, "Field-induced color switching in liquid crystal displays", J. Chem. Phys. vol. 71, No. 6, 1979, pp. 2336-2344.

G. Pelzl et al., "Field-induced Colour Change of Liquid Crystalline Dyes", Kristall und Technik, 1979, vol. 14, No. 7, pp. 817-823.

Niels Jacksen et al., "Magneto Optical Static Event Detector", EOS/ESD Symposium, 1998, pp. 233-244.

Richard V. Gregory et al., "Chameleon Fibers: Dynamic Color Change From Tunable Molecular and Oligomeric Devices", National Textile Center Annual Report: Nov. 2001, M98-C01, pp. 1-10, http://www.furman.edu/~hanks/ntc/.

3M™ EM Aware TNG—ESD Event Monitor—Essential Tools for ESD/EMI Management, 2010, 2 pages, downloaded from http://multimedia.3m.com/mws/mediawebserver?mwsId=SSSSSu7-zK1fslxtUO8_vnxtSev7qe17zHvTSevTSeSSSSSS--&fn=EM20%20Aware%20TNG%20Prod%20Bulletin.pdf.

"Electrochromic Polymers", 2 pages, undated, downloaded from http://www.chem.ufl.edu/~reynolds/research/ on Mar. 26, 2012.

* cited by examiner

| | 405 | 410 | 415 |
|---|---|---|---|
| 400 → | ESD Indicator Color | ESD Field Strength (V) | ESD Severity Rating |
| | Color 1 | < 500 | 0 |
| | Color 2 | 500 to < 1000 | 1 |
| | Color 3 | 1000 to < 2000 | 2 |
| | Color 4 | > 2000 | 3 |

| 455 | 465 | 470 | 475 | 480 | 485 |
|---|---|---|---|---|---|
| Structure ID | Step 1 Rating | Step 2 Rating | Step 3 Rating | Step 4 Rating | Cumulative Rating |
| 001 | 0 | 0 | 0 | 0 | 0 |
| 002 | 0 | 3 | 0 | 0 | 3 |
| 003 | 1 | 1 | 1 | 0 | 3 |

VISUALLY DETECTING ELECTROSTATIC DISCHARGE EVENTS

FIELD OF THE INVENTION

The invention relates to integrated circuits and, more particularly, to visually detecting electrostatic discharge events in integrated circuits and other structures.

BACKGROUND

Electrostatic discharge (ESD) is a sudden and momentary electric current that flows between two objects having different electric potentials due to an accumulation of charges. The amount of accumulated charges can vary based on the stored capacitance of an object with respect to another object. All materials are sources of ESD. For example, the human body can store a charge as high as 25,000 volts.

ESD is of particular concern during manufacturing of semiconductor devices. ESD damage can occur for a variety of reasons including, most commonly, through human contact. Other sources of ESD damage include placement of synthetic materials (e.g., plastic, Styrofoam, etc.) on or near electronic equipment and the rapid movement of air near electronic equipment (e.g., due to the use of compressed air to blow dirt off printed circuit boards, placement of circulating fans blowing on electronic equipment, or using an electronic device close to an air handling system). In all of these scenarios, the accumulation of static charges may occur without detection. To make matters worse, direct contact between objects is not required for an ESD event to occur.

There are several steps that semiconductor manufacturers take to prevent ESD damage. For example, they maintain controlled environments including Faraday cages, wrist/foot straps, anti-static mats, conductive flooring material, ion fans, and/or humidity controls. Further, semiconductor devices designs can incorporate built-in ESD protection. However, such measures may not eliminate ESD damage and the resulting manufacturing yield loss.

When a semiconductor device fails, an investigation may be performed to identify whether ESD damage was the cause of the failure. Often, such investigation is unable to identify the source of the failure and, instead, a time-consuming failure analysis may be performed to tear down the device and examine any physical damage for clues as to its source. Yet, determining that physical damage was caused by ESD may still not identify how or when the ESD event occurred. For instance, it may be difficult to determine whether the ESD damaged occurred during manufacturing or after a semiconductor device was delivered to a customer.

Accordingly, there exists a need in the art to overcome the deficiencies and limitations described hereinabove.

SUMMARY

In an aspect of the invention, a method comprises providing a structure including an ESD indicator comprising an electric field sensitive material configured to undergo a specific color change in response to an electric field. The method further comprises visually determining an exposure of the structure to an ESD event via the specific color change of the ESD indicator.

In another aspect of the invention, a structure comprises an object and an electrostatic discharge (ESD) indicator including an electric field sensitive material that is configured to change into one of a plurality of predetermined colors corresponding, respectively, to a plurality of predetermined electric field strength ranges.

In another aspect of the invention, there is a computer program product comprising a computer usable storage medium having a computer readable program stored in the medium. The computer readable program, when executed on a computing device, is operable to cause the computing device to encode an image of an object including an electrostatic discharge (ESD) indicator. The computer readable program is further operable to cause the computing device to determine a color of the ESD indicator in areas of the image. The computer readable program is further operable to cause the computing device to correlate the determined color of the ESD indicator with a color reference. The computer readable program is further operable to cause the computing device to correlate the color reference to one of a plurality of predetermined ratings of ESD severity. The computer readable program is further operable to cause the computing device to record an ESD history of the object associating an identifier of object with the one of the plurality of predetermined ratings of ESD severity.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIGS. 4A and 4B show exemplary data structures in accordance with aspects of the invention.

DETAILED DESCRIPTION

The invention relates to integrated circuits and, more particularly, to visually detecting electrostatic discharge events in objects and structures, such as integrated circuits. Embodiments of the invention quantify an object's exposure to a high-electric field by determining a specific color change of an indicator material included in the object. Further, embodiments correlate the color change caused in the indicator material to reference colors corresponding to ESD events having different characteristics (e.g., voltage magnitude). Further, embodiments record information describing the electric field exposure history of individual objects based on the color change caused in the indicator material.

Figure 1:
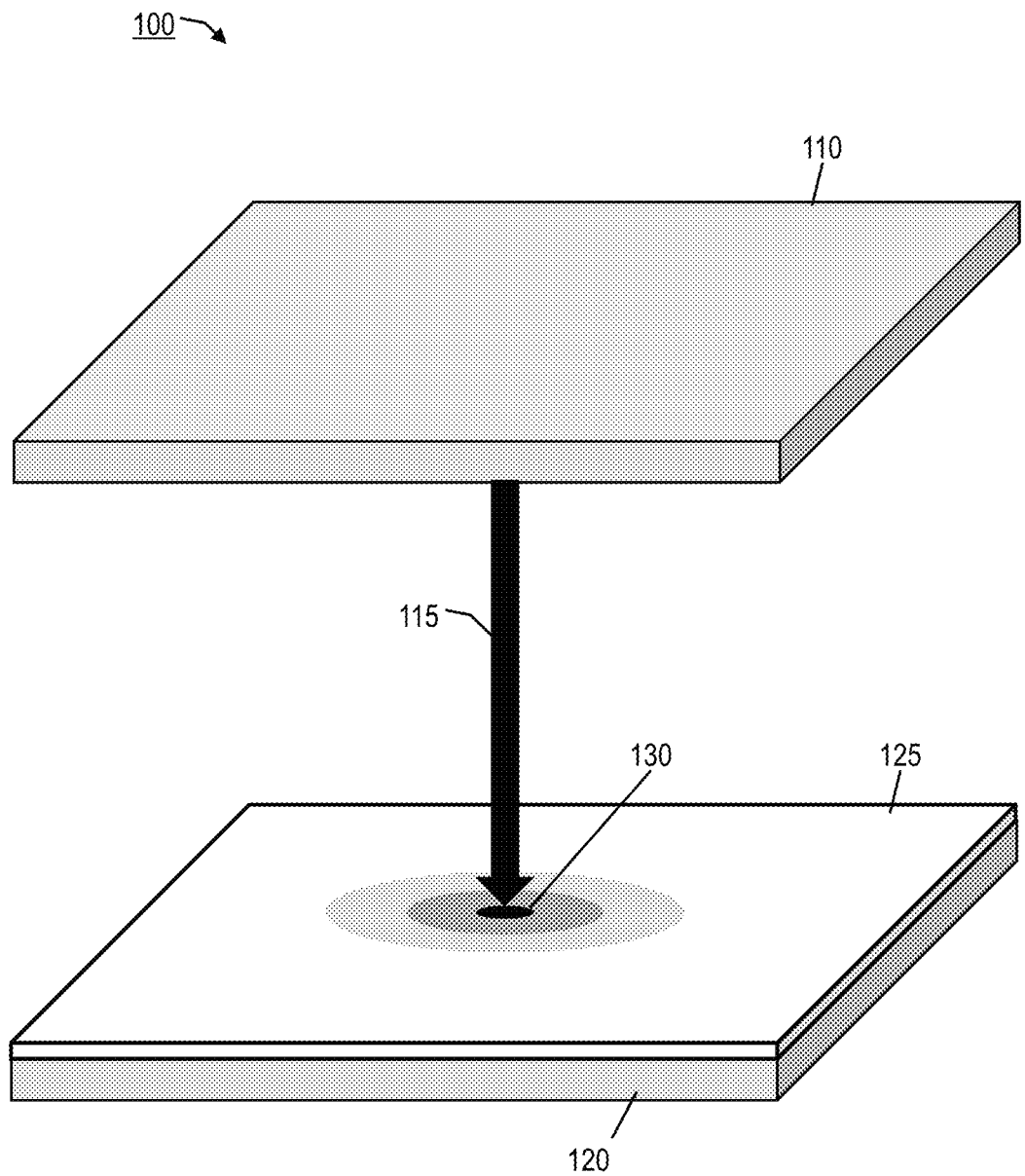
FIG. 1 shows an illustrative environment in accordance with aspects of the invention.

FIG. 1 shows an exemplary environment 100 that is illustrative of aspects of the invention. The environment 100 includes a source object 110 that provides an ESD 115 to a receiver object 120 via direct contact between the objects, via a conductive object, or via the atmosphere surrounding the objects. The environment 100 can be any space in which the source object 110 and the receiver object 120 reside. In embodiments, the environment 100 is a space within a manufacturing plant or a customer facility. For example, the environment 100 may be a production line, a room, a workshop, a laboratory, or a workstation in which the receiver object 120 is manufactured, processed, handled, tested, and/or installed.

The source object 110 can be any object or structure capable of developing an electric potential sufficient to generate an ESD. In embodiments, the source object 110 includes objects in the atmosphere that cause ESD (e.g., lighting strikes) that can damage the receiver object 120. In embodiments, the source object 110 includes objects and structures inside a building, such as a manufacturing plant or a customer facility. For example, the source object 110 may be surfaces of the building, including floors, walls, ceilings, desktops, workstations, and processing apparatuses. In embodiments, the source object 110 includes objects, machines, and devices that handle the receiver object 120, such as people, robots, processing machines, packaging machines, carts, and trays.

The receiver object 120 can be any object or structure capable of receiving the ESD 115. The receiver object 120 may be one or more objects or structures inside a building, such as a manufacturing plant or a customer facility. For example, the receiver object 120 may be surfaces of the room, including floors, walls, ceilings, desktops, workstations, and processing apparatuses. In embodiments, the receiver object 120 is a manufactured object, such as a semiconductor structure, an integrated circuit device, or printed circuit board, as well as their structures, connectors, and coatings. In embodiments, the receiver object 120 can be a dedicated ESD detector that changes to a specific color to provide a visual indication 130 of an ESD discharge at or around a location, in the form of strips, pucks, plates, mats, or boards. For example, an ESD sensor in the form of a puck may be placed in a carrier (e.g., a cart or a tray) used to transport semiconductor device between work locations.

In embodiments, the ESD indicator 125 is a substance provided on or incorporated in the receiver object 120 that includes an electric field sensitive (i.e., electrochromistic) material configured to undergo a specific color change of in response to an electric field. The color change of the ESD indicator 125 can visually indicate characteristics of the ESD 115, such as the location, the field strength, the direction, and/or the duration of the ESD 115. In this manner, the ESD indicator 125 provides the visual indication 130.

According to aspects of the invention, the ESD indicator 125 produces multiple different colors corresponding to different ESD field strengths. In embodiments, the ESD indicator 125 is comprised of a single electrochromistic material configured to vary between multiple different colors corresponding to a different, predetermined ESD ranges (rate, intensity, and/or duration). Alternatively, in embodiments, the ESD indicator is comprised of multiple variations of an electrochromistic material where each variation is tuned to produce a different color corresponding to a different, predetermined ESD range.

The ESD indicator 125, when unaffected by an ESD, may have an initial color or no color (i.e., transparent). When affected by an ESD, the color of the ESD indicator 125 may change may be between hues of a single color (e.g., light blue, blue, indigo, and black) or the indicator may change to entirely different colors (e.g., yellow, green, red.) Alternatively, in embodiments the visual indication can change to a single color corresponding to a particular electric field range (e.g., greater than 500 V). Additionally, when affected by an ESD, the colors of the ESD material may photoluminescence.

Furthermore, in embodiments, the ESD indicator 125 can be configured to permanently change color to provide a cumulative history of a structure's exposure to electric fields. Alternatively, in other embodiments the ESD indicator can be configured to temporarily change color. For example, the temporary color change of the ESD indicator can be configured to automatically return (e.g., switch or fade) to the indicator's original color over a period of time (e.g., seconds, minutes or hours) after exposure to an electric field. Or, for example, the temporary color change of the ESD indicator can be configured to be manually reversible to the indicator's original color when it is exposed to a low electric field (e.g., >500V).

The ESD indicator 125 can include any electrochromistic material that reversibly or irreversibly changes color when exposed to an electric field. In embodiments, the ESD indicator is one or more of the following electrochromistic materials: a PProDOT (i.e., 3,4-propylenedioxythiophene), a PProDOP (i.e., 3,4-propylenedioxypyrrole), a polyaniline, a viologen, a polyoxotungstate, tungsten oxide ($WO_3$), chiral nematic liquid crystals, monomeric molecules and oligomeric molecules. Other electrochromistic materials may be used within the scope of this invention. For example, one or more electrochromistic materials may be selected based on the desired sensitivity level(s) of an object or structure.

In embodiments, the sensitivity levels of an electrochromistic material(s) included in an object or structure are about 50V, 100V, 500V, 1000V, and/or 2000V based on ESDA/JEDEC JDS-001-2012 ESDA/JEDEC Joint Standard for Electrostatic Discharge Sensitivity Testing—Human Body Model (HBM)—Component Level. In other embodiments, the sensitivity levels of an electrochromistic material(s) included in an object or structure are about 50 V, 125 V, 250 V, and/or 500 V based on t ANSI/ESD S5.3.1-2009 Electrostatic Discharge Sensitivity Testing—Charged Device Model (CDM)—Component Level. In other embodiments, the sensitivity levels of an electrochromistic material(s) included in an object or structure are about 30 V, 75 V, 100 V, and/or 200 V, based on t ANSI/ESD 55.2-2009 Electrostatic Discharge Sensitivity Testing—Machine Model (MM)—Component Level. Other levels, ranges of levels, or combinations thereof may be used within the scope of this invention.

According to aspects of the invention, the ESD indicator 125 can be formed by placing the electrochromistic material on or integrating it within with the receiver object 120. For example, the electrochromistic material may be powderized or liquefied, and incorporated into a carrier agent (e.g., in solution or suspension) that attaches (e.g., binds or bonds) the electrochromistic material to the receiver object 120. In embodiments, the ESD indicator 125 is a coating on the surface of the object. For example, powderized electrochromistic material can be formed into an aerosol and sprayed onto surfaces, such as walls, floors, desktops, workstations, carts, manufacturing machines, etc. The ESD indicator can be incorporated into a liquid (e.g., in solution or suspension) and deposited onto the receiver object 120 by CVD, spin-on, curtain coating, bathing, brushing, etc. The electrochromistic material can be incorporated in a material, such as a coating (e.g., a film, laminate, shellac, sealant, insulator), a layer (e.g., a cap, an interface, a dielectric), an adhesive (e.g., epoxy), a fiber, or a fabric that forms a surface of the receiver object 120.

In embodiments, the ESD 125 indicator may be a material used to the manufacturing of a semiconductor device. For example, the electrochromistic material may be included in dicing tape, thermal interface material, adhesive (e.g., underfill, epoxies, resins), insulation, mold compounds, printed wiring boards, and films (e.g., dry-film laminates). In embodiments, the ESD indicator 125 can incorporated in fibers and, for example, formed into clothing, drapes, tarps, or fabric detector strips that can be placed or hung like flypaper to detect ESD events in a workspace. In embodiments, the ESD indicator 125 could be included in a dummy device which is included in a batch of semiconductor devices.

By placing ESD indicators, such as ESD indicator 125, in multiple locations, the ability to determine the occurrence, source, and damage due to ESD events is greatly enhanced, thereby simplifying efforts to identify, troubleshoot, and/or mitigate damage caused by ESD. For instance, a troubleshooter for a semiconductor production line can visually determine whether a faulty device was exposed to an ESD, where and when the exposure occurred, and/or quantify the exposure. Moreover, the troubleshooter can visually detect other locations of ESD events in and around a workstation where the device was handled to determine the source of the ESD.

Figure 2:
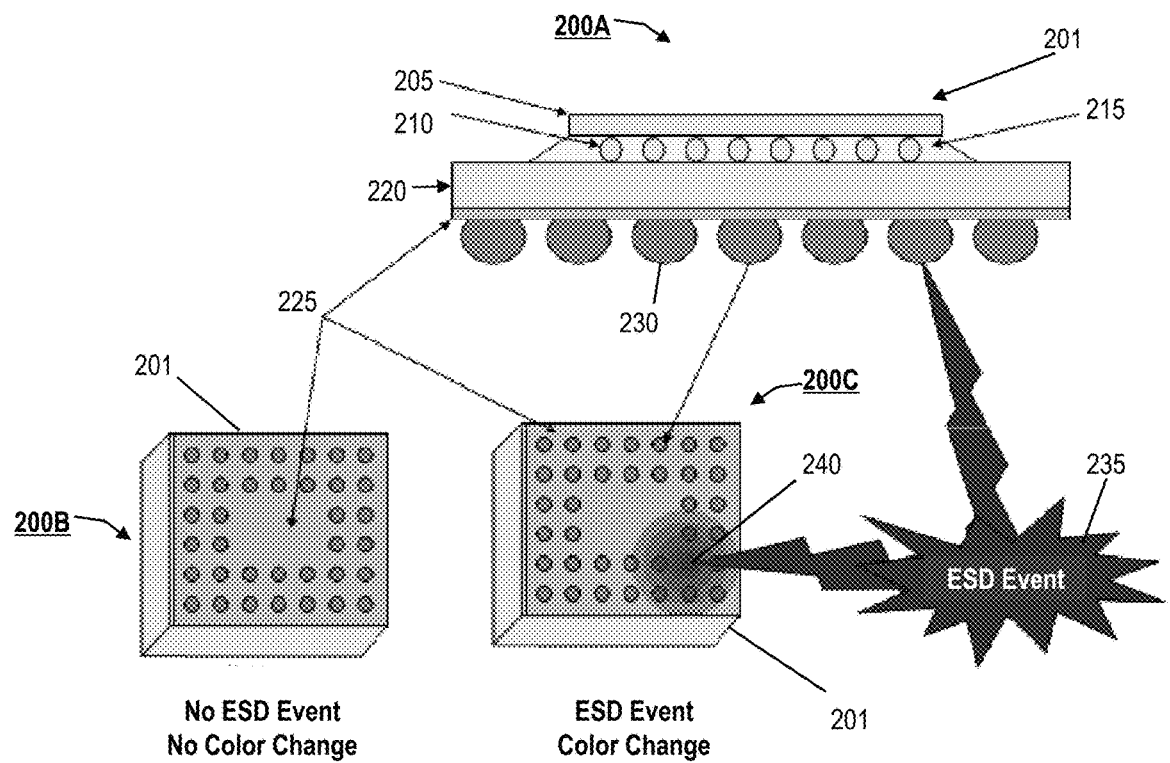
FIG. 2 shows an illustrative semiconductor device in accordance with aspects of the invention.

FIG. 2 illustrates several views 200A, 200B, and 200C of an exemplary semiconductor device 201 in accordance with aspects of the invention. Side view 200A illustrates various layers of the of the semiconductor device 201. In particular, the semiconductor device 201 includes a die 205, a controlled collapse chip connection (C4) layer 210, an underfill layer 215, substrate 220, an ESD indicator layer 225, and a ball grid array 230.

Views 200B and 200C show perspective views of the semiconductor device 201 before and after an ESD event 235 striking the ball grid array 230. As shown in view 200B there is no color change in the ESD indicator layer 225 before the ESD event 235. In other words, before the ESD event 235, the ESD indicator layer 225 beneath the ball grid array 230 is a substantially uniform, predetermined color (or lack thereof). For instance, the ESD indicator may be single color, a translucent color, or transparent.

As shown in view 200C, when the ESD event 235 strikes a location 240 on the ball grid array 230, the high electric field of the ESD event 235 induces a color change in the an ESD indicator layer 225 based one or more characteristics of the ESD (e.g., field strength, direction, rate, intensity, and duration). The ESD indicator layer 225 may change into one color at and/or around the location 240 of the ESD. Alternatively, the ESD indicator layer 225 may change into range of colors at or around the location 240 that varies depending on the field strength of the ESD 235 as the strength dissipates away from a point of contact at location 240. For example, at the contact point of the ESD where the electric field is the greatest, the ESD indicator layer 225 may change to a dark color (e.g., black) and to progressively lighter colors away from the contact point, as the electric field dissipates. Based on the size, shape, and spread of the different colors induced by the ESD event 125 in the ESD indicator layer 225, the strength, direction, and potential damage caused by the ESD event 235 can be visually determined.

The exemplary semiconductor device 201 shown in FIG. 2 includes the ESD indicator layer 225 as a layer under the substrate 220 and over the ball grid array 230. However, ESD indicator layer 225 can be placed on or integrated into one or more layers of the semiconductor device 201. For example, the ESD indicator layer 225 can be included in the underfill layer 215 or the substrate. Additionally, the ESD indicator layer 225 can be deposited over a coating or included within (e.g., blended, mixed, dissolved, polymerized) a coating layer.

System Environment

As will be appreciated by one skilled in the art, aspects of the present invention may be embodied as a system, a method, or a computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable mediums having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 3:
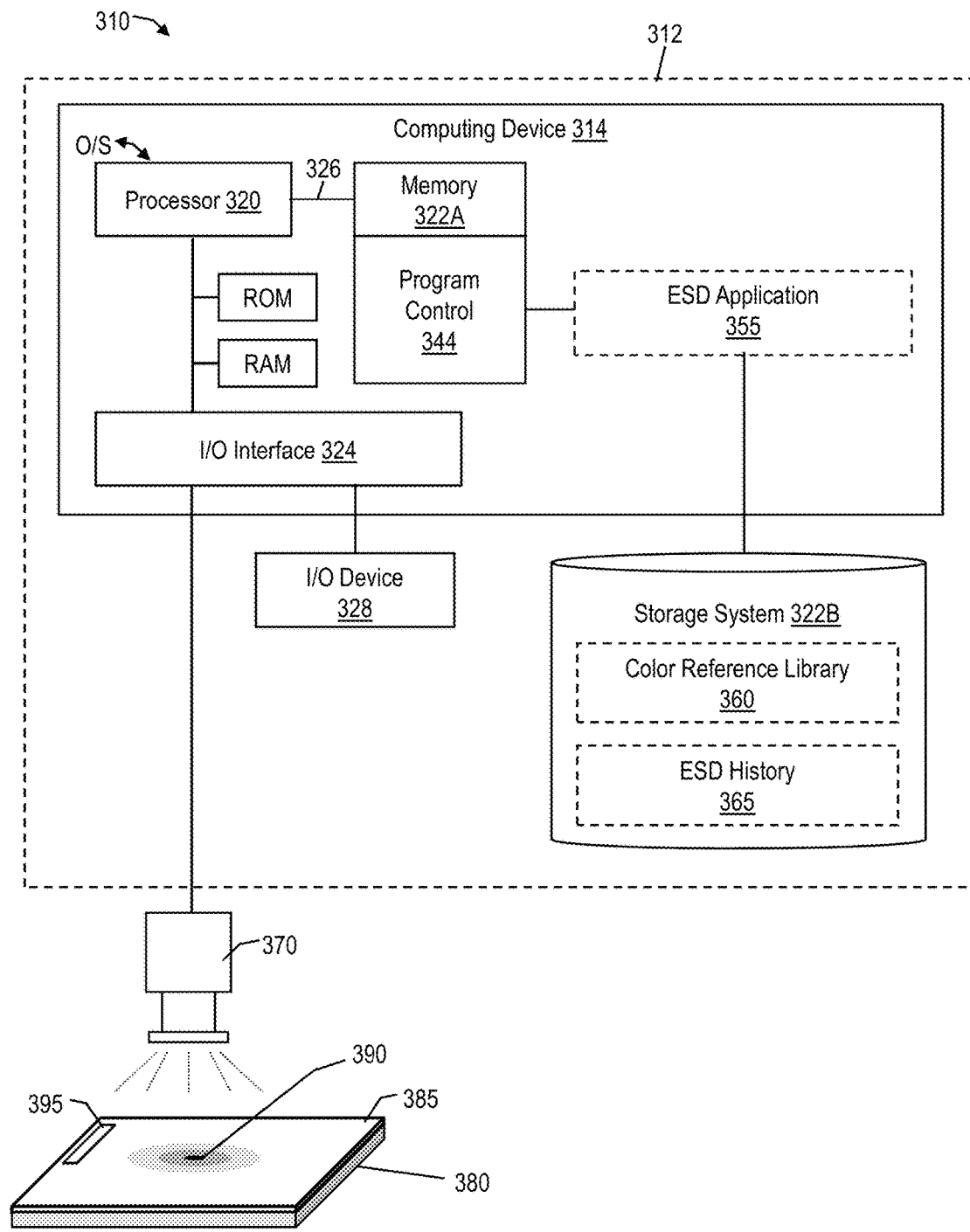
FIG. 3 shows an illustrative system in accordance with aspects of the invention.

FIG. 3 is an exemplary system 310 for implementing the steps in accordance with aspects of the invention. To this extent, the system 310 includes a server or other computing infrastructure 312 that can perform the processes described herein. In particular, the computer infrastructure 312 includes a computing device 314. The computing device 314 can be resident on a network infrastructure or computing device of a third party service provider (any of which is generally represented in FIG. 3).

The computing device 314 also includes a processor 320, memory 322A, an I/O interface 324, and a bus 326. The memory 322A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 314 is in communication with an external I/O device 328 and a storage system 322B. For example, the I/O device 328 can comprise any device that enables an individual to interact with the computing device 314 (e.g., user interface) or any device that enables the computing device 314 to communicate with one or more other computing devices using any type of communications link. The external I/O device/resource 328 may be for example, a handheld device, PDA, handset, keyboard etc. In accordance with aspects of the invention, the I/O device 328 enables the computing device 314 to communicate with a visual imaging device 370 to obtain and encode images. For instance, as shown in FIG. 3, the visual imaging device may capture an image of a structure 380 having an ESD indicator material 385 with a color change 390 due to an ESD event and an visual identifier 395 (e.g., a serial number).

In general, the processor 320 executes computer program code (e.g., program control 344), which can be stored in the memory 322A and/or storage system 322B. Moreover, in accordance with aspects of the invention, the program control 344 controls an ESD application 355 that performs one or more of the processes described herein. The ESD application 355 can be implemented as one or more sets of program code in the program control 344 stored in memory 322A as separate or combined modules. Additionally, the ESD application 355 may be implemented as separate dedicated processors or a single or several processors to provide the function of these tools.

While executing the computer program code, the processor 320 can read and/or write data to/from the memory 322A, the storage system 322B, and/or the I/O interface 324. The program code executes the processes of the invention, for example, the ESD application 355. Further, data read and/or write data to/from the memory 322A, the storage system 322B and/or the I/O interface 324 may include ESD application 355. The bus 326 provides a communication link between each of the components in the computing device 314.

In accordance with aspects of the invention, the ESD application 355 is computer program code stored in, for example, memory 322A and/or storage system 322B that, when executed by the processor 320, causes the computing device 314 to encode an image of an object (e.g., object 380), determine color changes (e.g., color change 390) in areas of an ESD indicator (e.g., ESD indicator 385) included in/on the object, as well as an identifier 395 of the object. Based on encoded image of the object, the ESD application 355 correlates the determined color to a predetermined electric field strength range (using, e.g., color reference library 360). The ESD application 355 detects a color change 390 in areas (e.g., pixels or groups thereof) of the ESD indicator 385, evaluates the color change 390 to determine characteristics of an ESD event (e.g., the location, the field strength, the direction, and/or the duration), and stores the characteristics in association with other information describing the object 380.

According to aspects of the invention, the color reference library 360 is information stored in a computer memory device (e.g., memory 322A and/or storage system 322B) includes information for correlating colors in areas the ESD indicator, such as color change 390 detected by the imaging device 370 with information characterizing ESD events. Further, according to aspects of the invention, the ESD history 365 is information stored in a computer memory device (e.g., memory 322A and/or storage system 322B) which characterizes ESD events with information describing a respective object, such as object 380. For example, the ESD history 365 may associate the identifier (e.g., identifier 395) of a semiconductor structure with a stage in a manufacturing process and ESD information (e.g., color, ESD field strength, and/or ESD severity range) determined by the ESD application 355.

The computing device 314 can comprise any general purpose computing article of manufacture capable of executing computer program code installed thereon (e.g., a personal computer, server, etc.). However, it is understood that the computing device 314 is only representative of various possible equivalent-computing devices that may perform the processes described herein. To this extent, in embodiments, the functionality provided by the computing device 314 can be implemented by a computing article of manufacture that includes any combination of general and/or specific purpose hardware and/or computer program code. In each embodiment, the program code and hardware can be created using standard programming and engineering techniques, respectively.

Similarly, the computing infrastructure 312 is only illustrative of various types of computer infrastructures for implementing the invention. For example, in embodiments, the server 312 comprises two or more computing devices (e.g., a server cluster) that communicate over any type of communications link, such as a network, a shared memory, or the like, to perform the process described herein. Further, while performing the processes described herein, one or more computing devices on the server 312 can communicate with one or more other computing devices external to the server 312 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

FIG. 4A shows an exemplary table 400 including color reference information, which may represent information stored in color reference library 360. According to aspects of the invention, color changes in ESD material included in an structure can be correlated (e.g., matching or determining similarities) with characterizing information based on the information stored in the table 400. The table 400 includes the following columns: ESD indicator color 405, ESD field strength 410, and ESD severity rating 415. The values of the ESD indicator color column 405 represent specific colors that an ESD indicator material may change due to a corresponding ESD field strength in column 410. For example, an ESD indicator material incorporated in a semiconductor may be configured to turn different shades of red depending on the corresponding ESD field strength shown in column 410. The values of the ESD field strength in column 410 may correspond to one or more predetermined models, such as those described above (i.e., HBM, CDM, or MM), The shades can be represented using, for example, using texturally (e.g., "R," "G" and "B") or numerically (e.g., using standard RGB values). In addition, column 415 in table 400 may include an ESD severity rating corresponding to each value in columns 405 and 410. For example, "0" rating may represent no color change from the original, unaffected ESD indicator material. A "1" rating may be considered relatively mild, a "2" rating may be considered progressively more severe, and a "3" rating may be may be considered the most severe. Other systems for representing color and/or severity may be used within the scope of this invention.

FIG. 4B shows an exemplary table 450 including ESD history information, which may represent information stored in color reference library 365. According to aspects of the invention, table 450 records information in columns 455, 465, 470, 475 and 480 describing ESD events for particular objects or structures as they pass through a multistep process. Column 455 contains data defining a structure identifier, which may correspond, for example, to identifier 395 of object 380 illustrated in FIG. 3. Columns 465, 470, 480, and 485 contain data associated with ESD events (e.g., ESD event 390) detected by an ESD indicator (e.g., ESD indicator 385) at different steps in the process. A zero (0) entry in column 465 indicates that no ESD event ESD greater than or equal to a first threshold field strength (e.g., 500 V as shown in column 410 of FIG. 4A) was detected at that step (e.g., step 1) for that structure (e.g., ID 001). A non-zero entry (e.g., 1, 2, 3) indicates an ESD event was detected for that structure at that step. In embodiments, the possible non-zero entries in columns 465, 470, 480, and 485 correspond to the ESD severity ratings at column 415 of FIG. 4A. For example, the entry in field 487 at column 470 indicates that, based on a color change (e.g., color 4 at column 405 in table 400), an ESD event of severity rating three (3) (e.g., at column 415 in table 400) was detected for a structure having ID 002 in step 2 of the process.

For example, the ESD history information may correspond to steps performed on a semiconductor structure in an IC manufacturing process. At each step of the manufacturing process, an ESD event may occur. Using one or more ESD indicators, a troubleshooter may identify that an object (e.g., object 380) was affected by an ESD event (e.g., ESD event 390), quantify the ESD event based on a color change in the ESD indicator and correlate the color change to a color the information in table 400. Further, the correlated color may correspond to an ESD field strength in column 410 and a ESD severity in column 415 for that color. Based on this information, a corresponding record in table 450 for the semiconductor structure may be updated. For example, a field 487 in the table 450 for structure 002 identified in column 455 of indicates that a ESD event of severity "3" occurred in step 2 of the process. In contrast, the record for structure 001 in column 455 indicates that this structure encountered no ESD during the process. Further, column 485 indicates a cumulative ESD exposure during the process information for each structure. For example, table 450 shows structure 003 experienced three ESD events of severity "1," yielding a cumulative value of "3" in column 485. In embodiments, the structure may be considered defective (e.g., ruined) when the cumulative rating is greater than or equal to a predetermined threshold value (e.g., "3").

The values in columns 455, 465, 470, 475 and 480 can be determined by visual inspection of objects including ESD indicator material. In embodiments, a human can perform the visual inspection. For example, a troubleshooter on a semiconductor manufacturing line may observe a color change in the ESD indicator on an object, compare the observed color to a reference color (e.g., color 4 at column 405 in table 400), and record a corresponding ESD field strength (e.g., ESD field strength (V) ">2000" at column 410 of table 400) and/or an ESD severity rating (e.g., ESD severity rating "3" at column 415 in table 400) at field 487 in table 450). Alternatively or additionally, in embodiments, the visual inspection can be performed by a machine vision system using, for example, such as computing device 314 including ESD application 355 and imaging device 370.

Based on the information in table 450, a manufacturer may verify that no ESD events affected an object during manufacturing. As such, if the object is later returned by a customer with ESD damage, the manufacturer can determine that the damage occurred after the object left the manufacturer's possession. Further, based on the information stored in table 450, it may be determined at which point in a process ESD events are occurring, thereby allowing the source of the ESD events to be addressed.

Flow Diagrams

According to aspects of the invention, a method is provided for quantifying high electric field exposure, including determining a specific color change of an ESD indicator material including in an object or a structure, correlating the color change to an electric field history, providing visual indication of cumulative electric field exposure, and providing a temporary record of individual component quality.

Figure 5:
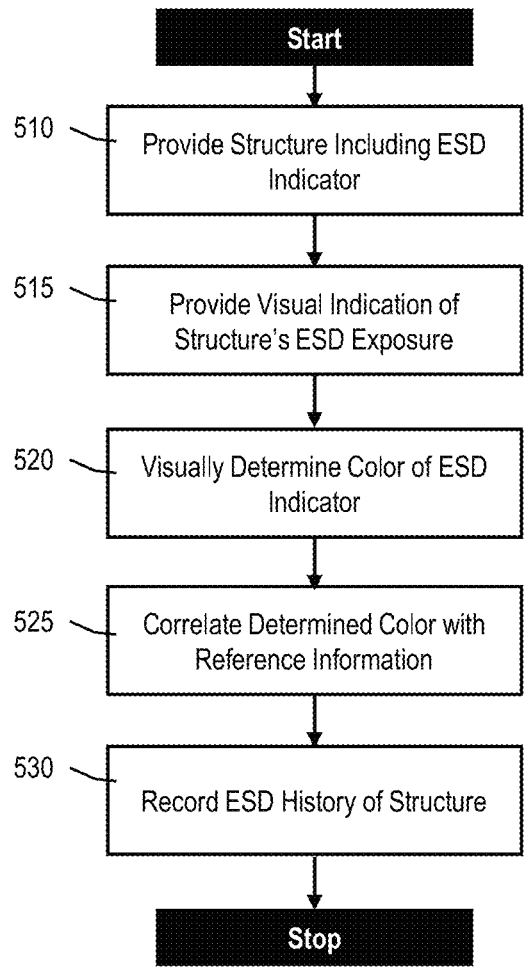
FIG. 5 shows a flow diagram of an exemplary process in accordance with aspects of the invention.

FIG. 5 shows exemplary process flows for performing aspects of the present invention. The steps of FIG. 5 may be implemented in the environments and systems of FIGS. 1-3. The flowchart in FIG. 5 illustrates the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Furthermore, the invention can take the form of a computer program product accessible from a computer-usable or computer-readable medium providing program code for use by or in connection with a computer or any instruction execution system. The software and/or computer program product can be implemented in the environments and systems of FIGS. 1-3. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disc—read/write (CD-R/W) and DVD.

FIG. 5 shows a flow diagram of an exemplary process usable to quantify high electric field exposure, including determining a specific color change of an ESD indicator material including in a structure, correlating the color change to an electric field history, providing visual indication of cumulative electric field exposure, and providing a temporary record of individual component quality. At step 510, a structure (e.g., structure 380) including an ESD indicator (e.g., ESD indicator 385) is provided. In embodiments, providing the structure includes manufacturing, processing, or altering a structure to include electrochromistic material, such as described above with respect to FIGS. 1 and 2. For example, a manufacturing process for semiconductor devices or printed circuit boards may add the ESD indicator to the structure. Further, the ESD indicator may be included on or in fabrics, mats, and plates, etc. Further, the ESD indicator may included on or in surfaces such as walls, desks, workstations, processing machines, and transportation devices, etc.

At step 515, a visual indication of the structure's exposure to an electric field provided. In the event the structure is exposed to an ESD, the ESD indicator material can change from an original (i.e., unaffected) color to a specific color (e.g., color change 390) indicating the strength, duration, and/or direction the ESD event. For example, for an ESD event of less than 500 volts the indicator material may be configured retain a first, baseline color; whereas, for an ESD event of greater than 500 V the indicator material may be configured to change to a second, predetermined color corresponding to the field strength of the ESD event. Further, based on the color change, the area of the color change, and/or the shape of the color change, an ESD events' location, direction, and intensity can be characterized.

At step 520, the color of ESD indicator included in a structure is visually determined. In embodiments, a troubleshooter visually inspects the object and identifies the color of the ESD material. Additionally or alternatively, a computing device including a machine-vision system, such as that shown in FIG. 3, which encodes an image of the object including the ESD indicator and determine the color at one or more locations of the object (e.g., for each pixel of an image or for groups of pixels).

At step 525, the detected color is correlated to predefined reference information. In embodiments, the troubleshooter manually compares the determined color of the ESD indicator with reference color information, such as described above with respect to FIG. 4A. Additionally or alternatively, as described above with respect to FIG. 3, a computing device compares an encoded image of the object with reference information (e.g., a color reference library).

At step 530, the ESD history of the structure is recorded. In embodiments, recording the ESD history includes logging a value corresponding to individual and/or cumulative ESD exposure of a particular structure. For example, as shown in table 450 shown in FIG. 4B, each structure in a process may have a corresponding record including fields to that identify each ESD event that the object encountered during the process steps, as well as a cumulative value of all the ESD events that occurred. Based on the recorded ESD event information, a manufacturer can determine when and how the structure was affected by ESD.

As set for the above, embodiments of the invention provide visual indication on objects of ESD events. By doing so, the source, time, and severity of the ESD events may be determined allowing improved mitigation of the ESD cause and, thereby, providing for more efficient troubleshooting, mitigation, and/or correction of ESD damage. As such, yield loss due to part failures can be substantially reduced.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
providing an electrostatic discharge (ESD) indicator on a surface of a structure, the ESD indicator comprising an electric field sensitive material configured to undergo a specific color change in response to an electric field and return back to its original color after a predetermined time period, the specific color change indicating a location, field strength, direction, and duration of an ESD event;
visually detecting an exposure of the structure to the ESD event via the specific color change of the ESD indicator between two or more different colors; and
quantifying a severity of the ESD event based on a color resulting from the specific color change,
wherein the electric field sensitive material comprises an electrochromistic material.

2. The method of claim 1, wherein:
the structure comprises a semiconductor device; and
the providing comprises manufacturing the semiconductor device including the electric field sensitive material.

3. The method of claim 2, wherein the manufacturing the semiconductor device including the electric field sensitive material comprises incorporating the electric field sensitive material in a layer of the semiconductor device.

4. The method of claim 1, wherein:
the structure comprises a printed circuit board; and
the providing comprises manufacturing the printed circuit board including the electric field sensitive material.

5. The method of claim 1, wherein the structure comprises a dedicated ESD detector in the form of a strip, puck, or plate.

6. The method of claim 1, wherein the undergoing the specific color change comprises providing a visual indication of cumulative ESD exposure for the structure.

7. The method of claim 1, wherein the electrochromistic material is a single electrochromistic material configured to vary between multiple different colors corresponding to different, predetermined ESD ranges.

8. The method of claim 1, wherein the electrochromistic material comprises multiple variations where each variation is tuned to produce a different color corresponding to a different, predetermined ESD range.

9. The method of claim 1, wherein the visually determining the color of the ESD indicator comprises:
encoding an image of the structure; and
correlating an area of the encoded image with a color reference.

10. The method of claim 1, further comprising correlating the color of the ESD indicator with reference information corresponding to an ESD severity.

11. The method of claim 9, further comprising recording an ESD event history of the structure, the ESD event history associating an identifier of structure with the reference information corresponding to the ESD severity, wherein the ESD event history of the structure associates the reference information corresponding to the ESD severity with one of a plurality of predefined steps in a process.

12. A structure comprising:
an object; and
an electrostatic discharge (ESD) indicator comprised of an electric field sensitive material,
wherein:
the ESD indicator is a coating attached to a surface of the object;
the ESD indicator is configured to change into one of a plurality of predetermined colors corresponding, respectively, to a plurality of predetermined electric field strength ranges, locations, directions and durations of an ESD event; and
the electric field sensitive material is composed of one of: (i) a single electrochromistic material configured to vary between multiple different colors corresponding to the plurality of predetermined electric field strength ranges; and (ii) multiple variations of an electrochromistic material where each variation is tuned to produce a different color corresponding to the plurality of predetermined electric field strength ranges.

13. The structure of claim 12, wherein the electric field sensitive material is integrated within the object.

14. The structure of claim 12, wherein the object is a semiconductor device.

15. The structure of claim 12, wherein the object is a printed circuit board.

16. The structure of claim 12, wherein the electric field sensitive material is included in an adhesive.

17. The structure of claim 12, wherein the electric field sensitive material is included in a dry-film laminate.

18. The structure of claim 12, wherein the electric field sensitive material is included in a fabric.

19. The structure of claim 12, wherein the ESD indicator is configured to undergo a temporary color change.

* * * * *